United States Patent
Berger et al.

(10) Patent No.: US 6,528,145 B1
(45) Date of Patent: Mar. 4, 2003

(54) POLYMER AND CERAMIC COMPOSITE ELECTRONIC SUBSTRATES

(75) Inventors: Daniel George Berger, Wappingers Falls, NY (US); Shaji Farooq, Hopewell Junction, NY (US); Lester Wynn Herron, New Paltz, NY (US); James N. Humenik, LaGrangeville, NY (US); John Ulrich Knickerbocker, Hopewell Junction, NY (US); Robert William Pasco, Wappingers Falls, NY (US); Charles H. Perry, Poughkeepsie, NY (US); Krishna G. Sachdev, Hopewell Junction, NY (US)

(73) Assignee: International Business Machines Corporation, Armonk, NY (US)

( * ) Notice: Subject to any disclaimer, the term of this patent is extended or adjusted under 35 U.S.C. 154(b) by 135 days.

(21) Appl. No.: 09/606,359

(22) Filed: Jun. 29, 2000

(51) Int. Cl.[7] .............................. G02B 6/00; H05K 1/03; B32B 5/16

(52) U.S. Cl. .................... 428/156; 428/131; 428/306.6; 428/307.3; 428/212; 428/324; 428/327; 428/901; 428/209; 428/331; 361/750; 361/762; 174/256; 174/258; 385/147; 385/132

(58) Field of Search ................................ 428/156, 131, 428/306.6, 307.3, 212, 324, 327, 901, 209, 331; 174/256, 258; 361/750, 762; 385/147, 132

(56) References Cited

U.S. PATENT DOCUMENTS

| | | | | |
|---|---|---|---|---|
| 4,680,220 A | * | 7/1987 | Johnson | 174/209 |
| 4,810,563 A | * | 3/1989 | DeGree et al. | 165/185 |
| 4,849,284 A | * | 7/1989 | Arthur et al. | 174/255 |
| 4,882,455 A | * | 11/1989 | Sato et al. | 174/255 |
| 5,061,548 A | | 10/1991 | Arthur et al. | |
| 5,139,852 A | * | 8/1992 | Baise et al. | 428/209 |
| 5,213,878 A | * | 5/1993 | Moh et al. | 428/206 |
| 5,277,725 A | * | 1/1994 | Acocella et al. | 156/89.18 |
| 5,287,619 A | | 2/1994 | Smith et al. | |
| 5,358,775 A | | 10/1994 | Horn, III | |
| 5,384,181 A | | 1/1995 | Arthur et al. | |
| 5,541,249 A | | 7/1996 | Hughes et al. | |
| 5,552,210 A | * | 9/1996 | Horn et al. | 361/750 |
| 5,571,609 A | | 11/1996 | St. Lawrence et al. | |
| 5,670,262 A | * | 9/1997 | Dalman | 361/750 |
| 5,733,640 A | * | 3/1998 | Horiuchi et al. | 264/108 |
| 5,919,546 A | * | 7/1999 | Horiuchi et al. | 174/255 |
| 5,922,453 A | * | 7/1999 | Horn et al. | 428/323 |
| 5,965,273 A | * | 10/1999 | Walpita et al. | 106/286.4 |

* cited by examiner

Primary Examiner—William P. Watkins, III
(74) Attorney, Agent, or Firm—Ira D. Blecker (57) ABSTRACT

A composite electronic and/or optical substrate including polymeric and ceramic material wherein the composite substrate has a dielectric constant less than 4 and a coefficient of thermal expansion of 8 to 14 ppm/°C. at 100° C. The composite substrate may be either ceramic-filled polymeric material or polymer-filled ceramic material.

30 Claims, 5 Drawing Sheets

POLYMER AND CERAMIC COMPOSITE ELECTRONIC SUBSTRATES

BACKGROUND OF THE INVENTION

The present invention relates to polymer-ceramic composite interconnection substrates for high performance electronic and optical packaging solutions. The present invention is particularly concerned with highly thermally conductive and electrically insulating substrates with improved chip-to-substrate and substrate-to-card interconnection reliability by employing ceramic-filled polymers and polymer-filled ceramics for the packaging substrate with low dielectric constant and a coefficient of thermal expansion (CTE) close to that of the silicon device and the substrate or the substrate and the printed circuit board.

Multilayered interconnection substrates are used for the packaging or mounting of semiconductor devices. The substrate may comprise patterned metal layers which act as electrical conductors sandwiched between dielectric layers which act as electrical insulators. The substrates may be designed with termination pads for attaching, in addition to semiconductor devices, connector leads, capacitors, resistors, covers, etc. Interconnection between buried conductor levels can be achieved through metal-filled vias. The substrates can be made from a variety of ceramic and polymeric materials.

Multilayer interconnection packaging substrates where ceramic substrates with high density semiconductor devices are connected to a printed circuit board (PCB) with pins or solder bumps have the problem of thermal mismatch between contacting materials due to a significant difference in the coefficient of thermal expansion (CTE) between the ceramic chip carrier or the substrate and the PCB materials which impacts the second level joining reliability. Moreover, such ceramic substrates generally have high fabrication cost.

The printed circuit board materials are typically comprised of glass filled epoxy, typically FR-4 fire-retardant epoxy-glass laminates or prepregs, polyimide-glass, BT/Epoxy (bis-maleimide-triazine resins), and cyanate ester resin impregnated glass cloth. Other PCB base materials having higher glass transition temperature (Tg) and lower CTE that have been made available for improved thermal and electrical properties over conventional epoxy based circuit board materials include reinforced thermoplastics, typically, fiber reinforced polyester, glass microspheres filled polyester; PPO [poly(phenylene oxide)] and epoxy resin blends such as GETEK laminates and prepregs, polyimide-glass filler composite materials comprising polyester-imide, amide-imide-ester, or amide-imide as the matrix resin. For low dielectric constant polymer-filler composites, fluoropolymer based laminating materials typically derived from perfluoroalkylene such as poly (tetrafluoroethylene)(PTFE), copolymers of tetrafluoroethylene and hexafluoropropylene, and related materials have been extensively investigated. Fluoropolymers reinforced with fiber glass particulate are commercially available such as those from Rogers corporation under the trade name designation RO2800, RO2500, and related compositions. Fluoropolymer based composite materials are characterized by low dielectric constant, however, these materials have the problem of poor dimensional stability, low glass transition temperature (Tg), high CTE, poor adhesion to metals which requires elaborate bonding schemes, and have high thermal flow which causes heat induced via deformation in processes where laser etching is used for via formation. Also, the fluorocarbon polymer-based composite matrix is not compatible with photoimaging, an imaging option available with epoxies and polyimide based insulating materials. Some of these materials also suffer from poor thermal stability (i.e., they start degrading when heated to temperatures above about 250° C.).

The prior art is replete with those who have made efforts to make and improve the properties of composite substrates consisting of polymeric and ceramic materials.

U.S. Pat. No. 5,061,548 (Arthur et al.), the disclosure of which is incorporated by reference herein, describes a ceramic filled fluoropolymer composite material where the ceramic filler is precoated with a silane coupling agent, where the composite material is thermally flowable and is used as a bond-ply in a multilayer circuit board. U.S. Pat. No. 5,287,619 (Smith et.al.), the disclosure of which is incorporated by reference herein, describes a silane-coated silica filled fluoropolymer (PTFE) composite and its use in the fabrication of high density interconnect devices as multilayer MCM substrates by an additive process using multiple layers of copper and thermoplastic fluoropolymer composite dielectric. Solid Cu vias are used for interconnection between layers of MCM substrates or to semiconductor devices to be packaged in the module. U.S. Pat. No. 5,384,181 (Arthur et.al.), the disclosure of which is incorporated by reference herein, describes a silane-coated fused amorphous silica filled fluoropolymer composite where the silane coating material is a blend of phenyl silane and fluorosilane. These patents relate to fluoropolymers which have poor adhesion to metals, low glass transition temperature and high CTE (e.g., 70 ppm/°C. as disclosed in Arthur et al.)

U.S. Pat. No. 5,358,775 (A. F. Horn), the disclosure of which is incorporated by reference herein, is concerned with a high dielectric constant (k>4) and relatively high CTE (<35 ppm/°C.) electrical substrate material for microwave applications comprising a fluoropolymer filled with ceramic particles that exhibits low dielectric loss, high dielectric constant (K'>4), and high thermal coefficient of dielectric constant (TCK') for capacitors.

U.S. Pat. No. 5,541,249 (Hughes et.al.), the disclosure of which is incorporated by reference herein, discloses injection moldable polymer-filler composite compositions comprising organo-silicone polymer treated inorganic or metallic fillers in organic matrix resins including polyolefins, polyimides, polycarbonate, and polyacetals. Various inorganic fillers used include silicon nitride, carbide, alumina, aluminum nitride, titania, zirconia, and mixtures thereof, and the metals include iron, stainless steel, chromium alloy, nickel alloy and bronze. This patent merely discusses the materials and makes no mention of the applications of the material or their physical properties such as CTE and dielectric constant.

U.S. Pat. No. 5,571,609 (M. E. St. Lawrence el. al.), the disclosure of which is incorporated by reference herein, discloses a substrate material comprising a thermosetting matrix of polybutadiene and polyisoprene containing butadiene and isoprene, woven glass fabric, ceramic filler, fire retardant, and peroxide cure initiator. The composite material is claimed to have lower CTE in the z-direction and improved electrical performance. This class of materials, however, is unsatisfactory due to poor tear resistance, low Tg, low thermal stability, long cure times, high thermal expansion, low upper use temperature, poor solvent resistance, and susceptibility to photooxidation.

U.S. Pat. No. 4,810,563 (DeGree et al.), the disclosure of which is incorporated by reference herein, discloses a multilayer substrate article including top and bottom metal layers and insulating layers of ceramic-filled polyamide-polyimide matrix resin. The polyamide-polyimide layers are adhered to one another with an epoxy bonding layer. The disclosed article has the limitations of significant moisture absorption due to the poly(amide-imide) matrix, epoxy adhesive layer performance limitation in terms of its low thermal stability, low Tg which coupled with relatively high dielectric constant of the composite results in marginal properties of the entire package.

In plastic packaging structures, the integrated circuit (IC) devices are connected to an organic substrate fabricated using curable compositions containing a thermosetting binder such as polyepoxides, cyanate ester/epoxy resin blends with inorganic filler reinforcement. Thermoplastic composite dielectric materials having low dielectric constant, such as the particulate filled fluoropolymer composite laminates have been marketed by Roger Corp. for interconnection structures. Other low dielectric constant laminating materials that have been described for organic substrates structures are fabricated by impregnation of fluoropolymer laminates with thermosetting resins, typically cyanate ester resins.

Accordingly, it is a purpose of the present invention to have an organic-inorganic composite electronic substrate which is economical to manufacture.

It is another purpose of the present invention to have a composite electronic substrate which has a low dielectric constant, low impedance, low CTE, low birefringence, high package-to-card reliability, and low stress component interconnection stress.

It is yet another purpose of the present invention to have a composite electronic substrate which has a high $T_g$ and good thermal stability.

It is also the purpose of this invention to have a composite electronic substrate which has a low moisture absorption.

These and other purposes of the present invention will become more apparent after referring to the following description of the invention.

BRIEF SUMMARY OF THE INVENTION

The purposes of the invention have been obtained by providing according to a first aspect of the invention a composite electronic and/or optical substrate comprising a plurality of adjacent layers, each of the adjacent layers comprising a mixture of a polymeric and a ceramic material, wherein the substrate has a coefficient of thermal expansion of 8 to 14 ppm/°C. at 100° C. and a dielectric constant less than 4.

According to a second aspect of the invention, there is provided a composite electronic and/or optical substrate comprising a plurality of layers, each of the layers comprising a polymer-filled ceramic material wherein the substrate has a coefficient of thermal expansion of 8 to 14 ppm/°C. at 100° C. and a dielectric constant less than 4.

According to a third aspect of the invention, there is provided a composite electronic or optical substrate comprising a plurality of adjacent layers, each of the adjacent layers comprising a ceramic-filled polymeric material having 30 to 90 weight % polymeric material and 10 to 70 weight % ceramic material, wherein the substrate has a coefficient of thermal expansion of 8 to 14 ppm/°C. at 100° C. and a dielectric constant less than 4.

According to a fourth aspect of the invention, there is provided a method of making a composite electronic and/or optical substrate, the method comprising the steps of:

forming a dispersion of polymeric and ceramic materials;

forming a plurality of composite green sheets with the dispersion;

forming via holes in each of the green sheets;

filling a metal conductor in the via holes of each of the green sheets;

forming a metal conductor on a surface of each of the composite green sheets; and stacking and laminating the plurality of green sheets to form a composite electronic substrate of adjacent composite layers that has a coefficient of thermal expansion of 8 to 14 ppm/°C. at 100° C. and a dielectric constant less than 4.

According to a fifth aspect of the invention, there is provided a method of making a composite electronic or optical substrate, the method comprising the steps of:

forming a dispersion of polymeric and ceramic materials;

forming a plurality of green sheets with the dispersion;

forming via holes in each of the green sheets;

filling a metal conductor in the via holes of each of the green sheets;

forming a metal conductor on a surface of each of the green sheets;

stacking and laminating the plurality of green sheets to form a composite electronic substrate laminate;

heating the composite electronic substrate to thermally remove the polymeric material and any carbonaceous residue;

partially densifying the ceramic material to produce a rigid skeletal structure;

at least partially filling the rigid skeletal structure with a polymeric material to produce a composite electronic substrate that has a coefficient of thermal expansion of 8 to 14 ppm/°C. and a dielectric constant less than 4.

BRIEF DESCRIPTION OF THE DRAWINGS

The features of the invention believed to be novel and the elements characteristic of the invention are set forth with particularity in the appended claims. The Figures are for illustration purposes only and are not drawn to scale. The invention itself, however, both as to organization and method of operation, may best be understood by reference to the detailed description which follows taken in conjunction with the accompanying drawings in which:

DETAILED DESCRIPTION OF THE INVENTION

The present invention relates to a composite electronic and/or optical substrate comprising polymeric and ceramic material wherein the substrate has a low dielectric constant and a low CTE. More specifically, the functional requirements for the substrate include low CTE, preferably in the range 8–14 ppm/°C. at 100° C. which is intermediate between the FR-4 PCB (CTE 15–17 ppm(in the x,y directions) and 60 ppm(in the z direction) and the semiconductor device (CTE 3 ppm); dielectric constant <4, preferably <3.5 to allow for closely spaced high density fine lines/vias; good dimensional stability under thermal stress conditions; improved second level interconnection reliability; and package integrity even with increased die size.

Similarly, the functional requirements of the polymeric materials useful in the present invention should include low in-plane CTE; low birefringence and isotropic optical and mechanical properties; a low dielectric constant of 3.5 or less; high mechanical strength and high thermal stability at temperatures >300° C.; option for forming laminates/sheets, prepregs, or solution cast films; low melt viscosity suitable for injection molding; layer-to-layer and layer-to-metal adhesion reliability; chemical stability of the polymer-filler composite material under processing conditions; thermo-oxidative stability; and compatibility with photoimaging techniques.

Representative polymeric materials useful in the composite substrates of the present invention include: thermoplastic polyesters such as polybutylene terephthalate (PBTP), polyethylene naphthalate (PEN), polyarylene ether, and polycarbonate/polybutylene terephthalate blends; liquid crystalline polymer (LCP) polyesters, for example, p-hydroxy benzoic acid (HBA)/p-hydroxy naphthoic acid (HNA); PBTP-LCP, and PEN-LCP blends; polymethyl methacrylate (PMMA); poly(α-methylstyrene); polyvinyl butyral; blends of LCP and polyether imide (PEI), and LCP and polyethersulfone; flexible-planar chain polyimides; low CTE polyimides of rod-like structure; fluorinated polyimides and siloxane polyimides; polyimide/polyester films/laminates such as thermally conductive KAPTON (Dupont trade name), UPILEX (Ube Industries trade name); blends of polyimides with LC polyesters, B-stage glass reinforced polyester sheets; polyphenylene oxide-epoxy (PPO-epoxy) blends (e.g., GETEK laminates available from General Electric); polycyclo-olefins/polynorbornene (e.g., AVATREL resins (trade name, B. F. Goodrich Company); SILK polymers (trade name of Dow Chemical, Inc.); bis-benzocycolobutene polymers, for example, BCB-DVS, (CYCLOTENE resins (trade name, Dow Chemicals); polysilsesquioxanes; and cyanate ester resin, cyanate/epoxy, and BT/epoxy resins, BMI resins (bismaleimides).

Among the polyimide materials referred to above as one of the polymeric materials suitable for composite substrates according to this invention, a particularly preferred category are low CTE polyimides including BPDA-PDA, BPDA-ODA, PMDA-PDA and partially fluorinated polyimide carrying perfluoroisopropylidene functionality in either anhydride or in the amine segment or in both the anhydride and the amine (e.g., Pyralin RC2566, FPI fluorinated polyimides available from DuPont), partially fluorinated polyimides as PMDA-BDAF, BPDA-BDAF, and BTDA-BDAF derived from 2,2-bis[4-(4-aminophenoxy)phenyl]-hexafluoropropane (BDAF) and 1,2,3,4-tetracarboxylic dianhydride or pyromellitic dianhydride (PMDA), sym-biphenic tetracarboxylic acid dianhydride, and 3,3',4,4'-benzophenone tetracarboxylic acid dianhydride, respectively. Examples of non-fluorinated semi-flexible chain polyimides which can also be used include those derived from PMDA-ODA, e.g., Pyralin RC5878 polyamic acid precursor or KAPTON films available from DuPont, and BPDA-ODA polyamic acid precursor solution or the corresponding preimidized film as Upilex R available from Ube Industries Inc. The typical range of representative properties of the unfilled polyimide films after curing up to 350–400° C. include: $T_g$, greater than 260° C.; dielectric constant, 2.9–3.5; Eb % (elongation-at-break), 50–90%; elastic modulus, 2.5–10 GPa; CTE 3–50 ppm/°C. at 100° C. The partially fluorinated polyimides of this invention have excellent self adhesion and to other polymers and metals, and thus can be used for interlaminate bonding as well as self-bonding composite laminates without requiring an interlaminate bonding layer.

The low CTE polyimides for the purpose of the present invention are those derived from linear-planar or semiflexible precursors of which preferred candidates are the BPDA-PDA (sym-biphenic-tetracarboxylic acid dianhydride (BPDA)-p-phenylene diamine (PDA)) polyimide solution cast films as well as machine drawn chemically or thermally cured laminates available from Ube Industries under the trade name UPILEX. Because of the rigid-rod or semiflexible-planar molecular structure, this class of polyimides have special properties of low in-plane CTE (about 5 at 100° C. and 8 ppm at 300° C.), low dielectric constant (2.9–3.1), high modulus (8–11 GPa), high tensile strength (400–450 MPa), low moisture absorption (less than 1%), and high $T_g$ (>400° C.).

The preferred ceramic materials for the composite substrate have low coefficient of thermal expansion (preferably less than 8 ppm/°C. from room temperature to 400° C.) and low dielectric constant (preferably less than 6). Some of these ceramic materials may include electronic grade $SiO_2$, silylated silica, quartz, fused silica, $Al_2O_3$—$SiO_2$, $3Al_2O_3.2SiO_2$ (Mullite), BeO, silicates of Al, Fe or Mg such as $5SiO_2$—$2Al_2O_3.2MgO$ (Cordierite), other glasses such as borosilicate glass, and mixtures thereof. The ceramic materials can be in the form of a powder, fiber, sphere, microsphere, hollow sphere, flake, whisker, and the like. For isotropic proprties of polymer-filler composites, particularly CTE in the x, y, and z direction, it is preferred to use a filler in particle form.

The composite substrates of the present invention can be made by fabricating multiple layers of polymer-ceramic composite green sheets and then laminating them to form the composite substrates. The build of the composite substrate can be accomplished in parallel or sequentially. The composite substrate may have at least one surface layer especially adapted to support high density electronic metal conductors and/or high density optical waveguides for the transmission of electrons and/or photons. As will be described in more detail hereafter, the composite substrate can be made of ceramic-filled polymeric material or polymer-filled ceramic material. The former structure will be described first.

I. Ceramic-filled Polymer Substrate

A composite substrate consisting of layers of ceramic-filled organic polymer composite material, which are metallized using standard techniques, and metal vias for interlayer interconnection can provide a superior packaging structure for high performance semiconductor applications. Methods of forming polymer-filler composites as moldable or sheet castable formulations, and as laminates/B-staged prepregs are well known in the art. As one embodiment of this invention, a ceramic reinforced polyimide composite is formed by dispersing ceramic filler in a polyamic acid precursor solution which is then converted to molding compound by first solvent removal and then imidization to form polyimide. The molding powder can be compression molded under suitable temperature and pressure conditions to form composite sheets. Alternatively, the polyamic acid-ceramic filler dispersion or slurry can be cast on a carrier sheet by conventional coating processes such as curtain coating, roll coating etc., followed by solvent removal, and optionally partial or complete curing and removal from the carrier to obtain composite prepregs. The ceramic filler content is preferably in the range 10–70 wt % based on the ceramic-filled polymer composite material.

Such a composite multilayer substrate has the advantage of having an intermediate thermal expansion between a semiconductor device (about 3 ppm/°C. at 100° C.) and a conventional printed circuit board (about 17–18 ppm/°C. at 100° C.). The composite substrate consists of multiple dielectric layers of ceramic-filled polymeric material with via holes filled with an electrically conductive paste or alternatively, the vias can be filled with solid metal to provide interlayer interconnections.

The composite substrate can be fabricated from parallel processed layers or serial processed layers, or by a combination of the two. For example, the composite substrate could be built in parallel with stacked triplates such as a power core with a signal layer on either side and individual power layers between the cores. At least one suitable top layer could then be added to the composite substrate. Alternatively, a core structure could be formed by sequentially adding layers of dielectric and metal conductors. Then, at least one suitable top layer could be added to the core.

The metal fillers for conductive pastes for interlayer connections can be, for example, Cu, Ni, Pd or Ag powder with a low melting binary or ternary alloy such as eutectic Bi/Sn, In/Sn, Pb/Sn/Ag, In/Sn on Cu or Ni, Pb/Sn on Cu, Bi/Sn/Pb on Cu, Sn plated Cu, Bi-coated Cu. The conductive paste can constitute 60–90 wt % metal filler by weight of the total paste solids which comprises organic binder, conductive particles, additives, and may also include an inorganic component such as glass powder. Surface features are comprised of a high conductivity metal (e.g., Cu) which may have a Ni layer followed by a thin Au plated layer or surface finishing metallurgy for solder connections with the semiconductor device and the PCB.

Figure 4:
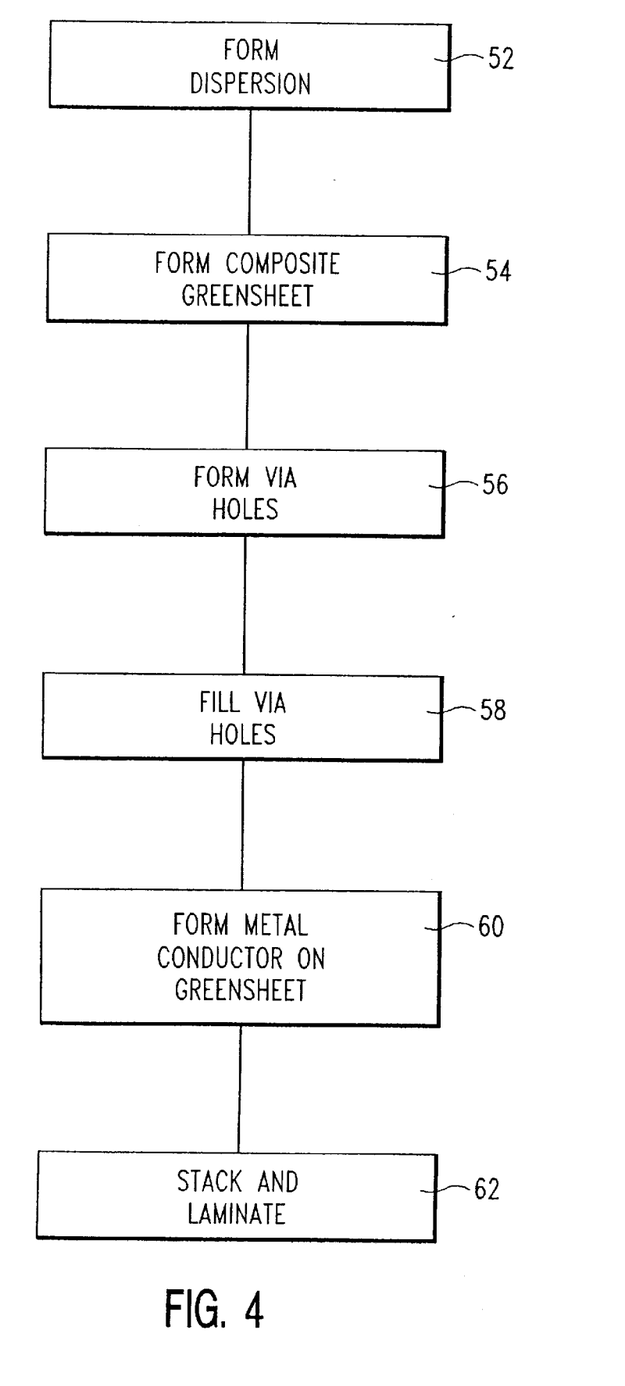
FIG. 4 is a flow chart illustrating the method to form the first embodiment of the present invention.

Referring now to the Figures in more detail, and particularly referring to FIG. 4, to form the ceramic-filled polymeric composite substrate, the ceramic fillers are mixed with the polymer matrix in a solvent carrier with appropriate additives such as a plasticizer, surfactant/dispersant, antioxidant and coloring agents to form dispersion 52. The aforementioned ingredients are mixed in a high shear mixing process using a planetary mixer or a ball mill or a roll mill to provide a homogeneous slurry for casting. For filler wettability and dispersion stability, it is generally desirable to surface modify the filler powder with coupling agents such as organosilanes or organotitanates prior to blending with the polymer binder system. Alternatively, a filler surface modifying agent is mixed with the polymer-solvent vehicle and other additive carrying binder system prior to blending in the ceramic filler.

A typical method for surface modification of filler particles to provide improved interaction with the matrix resin involves blending the ceramic powder with a 0.1–1.0% (wt %) solution of γ-aminopropyl triethoxysilane or A-1100 (Union Carbide) in methanol or ethanol and roll milling at room temperature for a few hours after which the liquid is removed under vacuum, and the treated solids are dried by heating to about 100° C. Other silane coupling agents for surface modification of the ceramic powder include vinyldimethyl ethoxy silane, vinyl trialkoxy silane, hexamethyl disilazane (HMDS), divinyl tetramethyl disiloxane (DVS) and related materials in the presence of aliphatic amines, e.g., n-propyl amine. An adhesion promoter can be added into the paste components if desired. Preferably, the polymer matrix selected is such that it contains a pendant functionality such as alkoxysilane or vinyl alkoxy silane having an affinity for the ceramic particle surface and thus providing in-situ surface modification. Similarly, organotitanate coupling agents can be used to surface modify the filler prior to blending with the binder system or these can be added to the binder system prior to blending in ceramic filler. Typical titanates commonly used for silica filler modification include isopropyl tri(dioctylpyrophosphato) titanate, isopropyl tri(ethylamino-ethylamino) titanate, and related materials.

The composite slurry thus formed is cast into sheets (called green sheets) on a carrier, typically PET, polyethylene, or polypropylene backing materials, or prepregs using the commonly practiced sheet casting process (54 in FIG. 4). Alternatively, composite polymer prepregs/sheets can be formed by melt-extrusion or injection molding techniques which are well known in the art. In the latter process, solvent-less thermoplastic polymer and inorganic filler blends as molding powder having melt viscosity suitable for injection molding at easily attainable temperature, are compression molded into laminates. In the case of slurry cast sheets, a follow-on drying operation is generally carried out to remove solvent in the cast sheets. Similarly, solvent carrying flexible-chain poly (amic acid) or poly (Amic ester) precursor solutions are filled with ceramic particles, then converted into molding compound by solvent removal and imidization by heating at 100–200° C. and compressive molded to B-stage laminates.

A blanking operation generates the desired size individual layers of the composite substrate and punches registration holes necessary for alignment. The backing sheet is then removed and vias are formed (56 in FIG. 4) in each layer by mechanical punching, laser drilling, mechanical drilling, e-beam machining or chemically etching, then filled with an electrically conductive metal (58 in FIG. 4).

The vias can be filled with a metallic paste as is conventional, for example by screen printing or squeegeeing the paste through a metal mask in contact with the composite laminate. Alternatively, the via metallurgy can be formed by filling with solid metal deposited by known techniques such as plating or subtractive etch, or by mechanically positioning electrically conductive metal spheres. Where the vias are filled by using a conductive paste, the metallized green sheets are dried. Then, the signal and wiring metallization patterns are formed on the surface of the green sheet layer (60 in FIG. 4) by screen printing or extrusion screening a conductive paste formulated with low melting metal filler using conventional multilayer ceramic fabrication techniques. Alternatively, the signal and wiring metallization can be formed from solid metal (such as by a decal process) and then transferred to the surface of the layer.

The metallized layers are subjected to a heating cycle at 100–250° C. to remove residual solvent and partially cure (B-stage) or completely cure the resin matrix.

The individual layers are inspected or electrically tested, then the desired number of layers are aligned and stacked (62 in FIG. 4), placing a thin non-stick polymer sheet on the top and bottom layers of the stack, and laminated using a hydraulic uniaxial press at 150–350° C. and 200–2000 psi pressure to form a multilayer composite interconnect structure. Subsequently, the laminated structure is subjected to a plating process for surface finishing metal deposition, typically Ni/Au by an electroless process.

Figure 6:
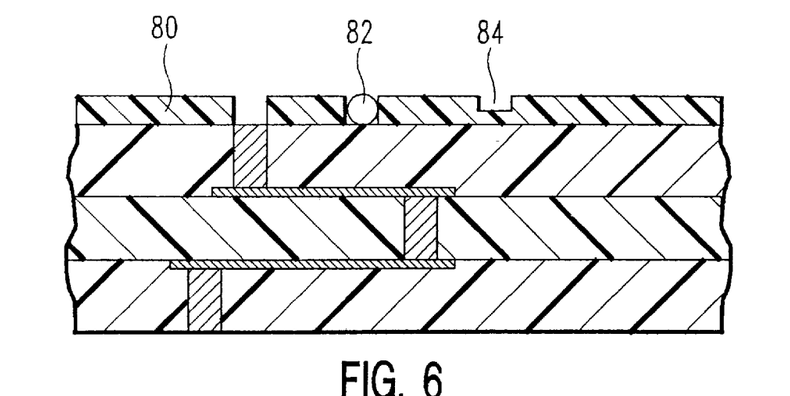
FIG. 6 is a cross-sectional view similar to FIG. 1 but with a surface layer in place for optical transmission of a signal.

Prior to surface finishing, at least one surface layer can be added that is especially adapted for supporting high density electronic metal conductors and/or high density optical waveguides for the transmission of electrons and/or photons, respectively, Such a surface layer is shown in FIG. 6 as surface layer 80 having waveguides 82 (e.g., an optical fiber) and/or 84 (e.g., an open channel). The composition of the surface layer 80 is 30 to 100% by weight polymeric material and 70 to 0% by weight ceramic.

Figure 9:
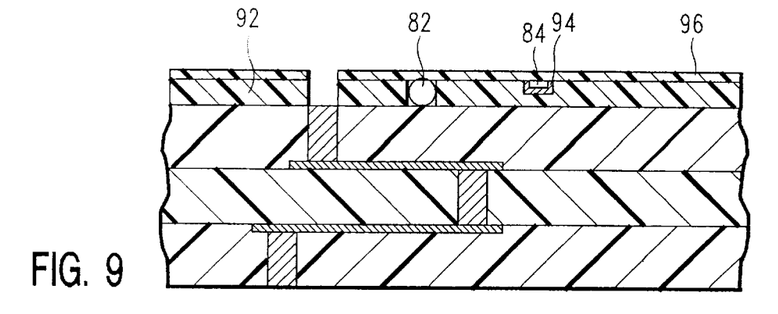
FIG. 9 is a cross-sectional view similar to FIG. 1 but with a layer in place for supporting optical transmission of a signal and a covering surface layer.

Alternatively, ceramic-filled polymeric layer 92 can be formed to support waveguide 82 and/or channel 84 as shown in FIG. 9. In this embodiment, channel 84 should be lined with a layer 94 of polymeric material. Note that channel 84 is left unfilled. Lastly, polymeric surface layer 96 is formed.

Where the surface layers 80, 102 and liner 94 are to be used for high density optical waveguides and channels, there should be no ceramic filler in the surface layer. The polymeric material should be an optically transparent, low (optical) loss material. Some exemplary materials for the surface layer are fluorinated polymers such as fluorinated and perfluorinated polyimides; acrylic polymers such as fluoroalkyl (methacrylate), perfluoro (methacrylate), and alkylmethacrylate homopolymers/copolymers such as PMMA and PMMA/polystyrene copolymers; polyetherketone; polyesters; and urethane-acrylic polymers. The waveguides can be optical fibers, open channels for optical transmission or optical waveguides. The dielectric material should preferably have a different index of refraction so as to refract the light and keep it within the waveguide.

If there is inadequate interlayer adhesion integrity, a thin layer of an adhesive polymer can be used for interlayer adhesion and bond integrity under various processing and use conditions. By way of illustration and not limitation, various adherants that can be used for bonding polyimide-based composite metallized layers include: acrylics, siloxane polyimides, acetylene terminated polyimides, e.g., IP-610 or IP-615 Thermid-Isoimide series derived from BTDA-APB (3,3',4,4'-tetracarboxylic acid benzophenone dianhydride/ 3,3"-bis-amino phenoxy benzene) polyisoimide oligomers and related 6FDA-APB derived polymers (available from National Starch), bisbenzocyclobutenes, divinylsiloxane-bisbenzocyclobutene polymers, for example, the DVS-bis-BCB polymer (CYCLOTENE resins, trade name of Dow Chemical), 6FDA-ODA and BTDA-ODA polyamic acids (available from DuPont), polyesters, polyalkylacrylates, or low molecular weight aromatic copolyesters or homopolyesters. The polymer adhesion layer interposed between composite layers results in layer-to-layer bonding under the temperature and pressure conditions for the lamination step. In the case of fully cured composite sheets, it is preferred to activate the surface by $O_2$ plasma exposure or by chemical means, e.g., chemical etching prior to applying an adhesion layer by spray, roll coating or any other commonly used surface coating techniques. The adherant coat is then baked to remove solvent or other volatiles and partially dry/cure to form a B-stage cured non-tacky surface. Subsequent processing can then proceed as described above to form via patterns, layer assembly, lamination, and deposition of finishing metallurgy to form an interconnect structure comprising a ceramic-filled polymer composite. Alternatively, the adhesion layer can be a fully cured thermoplastic melt-flowable polymer film which can be bonded to the ceramic-filled polymer composite layer by lamination prior to via punching or laser drilling, using standard techniques similar to the commercially available acrylic adhesive or TEFLON (trade name DuPont) bonded KAPTON (trade name DuPont), bond-ply laminates, PYRALUX (trade name DuPont) thermoplastic laminates, and related materials.

Figure 1:
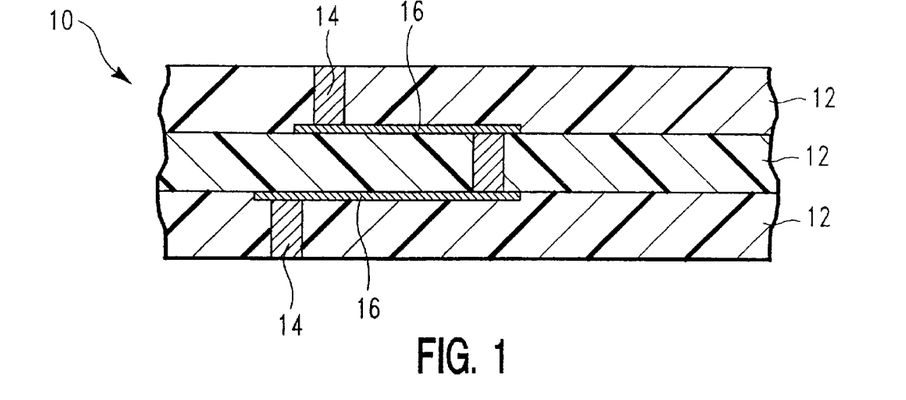
FIG. 1 is a cross-sectional view of a first embodiment of the present invention illustrating a ceramic-filled polymeric composite substrate.

The finished composite substrate 10 is illustrated in FIG. 1. Multiple layers of ceramic-filled polymeric material 12 are stacked and laminated so that they are adjacent to one another. Although not shown in FIG. 1, an adherent material optionally may be sandwiched between the layers to provide layer-to-layer bonding if necessary. The adherent material should be chosen so as to not degrade but preferably complement the properties (CTE, dielectric constant, $T_g$, thermal stability, etc.) as mentioned above for the composite substrate. The composite substrate 10 will preferably also comprise vias 14 and wiring lines 16.

The composite substrate is now ready for semiconductor device joining and interconnection to a PCB. Semiconductor joining can use conventional area array interconnections with or without underfill. The connections to the PCB can be made by using conventional surface mount technology such as ball grid arrays (BGA), land grid arrays (LGA) or pluggable interconnections. Benefits of the disclosed structure and process include low cost; dimensional control; low dielectric constant; low impedance; uniformity of feature size for high frequency, thinner dielectric layers; ability to process small feature sizes; and ability to tailor product attributes such as CTE, dielectric constant, toughness, thermal and thermooxidative stability, and desirable electrical and mechanical properties.

II. Polymer-filled Ceramic Substrate

A second embodiment according to this invention comprises metal conductors and a partially densified ceramic matrix which has been surface sealed or bulk filled with an organic or an organometallic polymer insulator having low dielectric constant, low CTE, and low moisture absorption. Fabrication of this structure can be obtained by using a multilayer-ceramic (MLC) type process involving preparation of a green sheet slurry comprising ceramic filler and a polymer binder system in a solvent vehicle, sheet casting on a carrier and solvent volatilization to form green sheets. After a drying operation to remove the solvent, and blanking operation, the individual layers are patterned for via definition by mechanical punching, laser drilling, mechanical drilling, e-beam machining, or chemically etching. Subsequent steps after via punching involve personalization employing a screen-on metal paste, drying, inspection of individual screened sheets, stacking and alignment, lamination, binder burn-off, densification of metal and partial sintering of the ceramic by subjecting it to an elevated temperature to produce a bisque fired "necked" rigid skeletal network or porous ceramic body. The structure is then treated with an organic or organometallic polymer solution or solvent-free polymerizable reactive monomer/oligomer composition such that it either forms a surface skin-like seal or fills the bulk matrix porosity. Subsequent thermal treatment to remove solvent and curing or polymerization provides a polymer encapsulated structure. Subsequent processing involves deposition of pad metallurgy, electrical test, semiconductor device joining, module electrical test and PCB connections.

Proportion of the polymer filler relative to the metallized ceramic composite body will depend on the level of porosity in ceramic, the filling of bulk porosity or only the surface region and encapsulation, and the density of metal pattern.

Preferred polymers for forming the green sheet slurry for the polymer-filled ceramic structure are those which essentially completely depolymerize to monomeric or thermally decompose to monomeric/oligomeric species which volatilize when conventionally heated in a binder burn-off heating cycle to 300–400° C. Various polymers suitable for this purpose include a poly(alkyl methacrylate), preferably, PMMA [poly(methyl methacrylate)], PMMA-poly-n-butyl methacrylate copolymers, poly(t-butyl methacrylate), PαMS [poly(α-methyl styrene)], polyvinyl butyral, poly (propylene oxide), and PIB [poly(isobutylene)], PMMA-PIB blends, which readily depolymerizes at temperature less than 400° C.

The electrically conductive metal paste for via fill may comprise a metal powder such as Au, Au-Cu, Au-Sn, Cu-Sn intermetallics, Ag plated Cu, or Au plated Ni, and optionally an inorganic particulate such a glass frit, in a polymer binder system which is readily removable by heating at less than 350–450° C. The mixture is milled in a roll mill to form an homogeneous paste.

In order to provide a polymer seal or encapsulation on the surface layers or for filling the porous regions in the bulk of the substrate, the structure is treated with a solvent-less or solvent carrying polymer or pre-polymer solution, preferably a solvent-less reactive oligomer composition, to flow in between the porous region in the ceramic network. For illustrative purposes, BCB resin solution or divinyl siloxane-bis-benzocyclobutene (DVS-BCB) prepolymer solution (CYCLOTENE resins, Dow Chemical Co.) is dispensed over the substrate in multiple applications, heated at 100–150° C. in-between applications to slowly remove solvent or low molecular weight species after each application, and a final cure to 350° C. in a programmed oven or furnace to form a thermally stable, solvent resistant polymer matrix encapsulating the ceramic bulk porosity. The BCB polymers are available as partially polymerized (B-staged) resins in solvent. The cured crosslinked polymers have several advantages, particularly, low dielectric constant (2.65 at 1 KHz to 1 MHz) and dielectric loss tangent (<0.0008 at 1 KHz), resistance to solvents when fully crosslinked, and high thermal stability, and low moisture absorption. Other low viscosity materials can also be used for back filling the ceramic porosity, for example, SILK polymers, polyarylene ether, low molecular weight cross linkable polyorganosilanes, such as poly (methylsilsesquioxane) which can be obtained in solution with high solids, can be dispensed similar to the BCB solution, and baked to temperatures up to 400° C. to form a crosslinked insulating matrix in ceramic skeletal network.

Examples of other thermosetting polymeric systems that can be used for post-sinter surface seal or bulk impregnation into the necked-ceramic bulk include acetylene terminated polyimides such as Thermid-Isoimide series of materials, for example, IP-610 or 615 oligomers; low CTE polyimides, e.g., BPDA-PDA, BPDA-ODA; bis-maleimide-triazine resins (BT-resin), cyanate ester-epoxy blends, poly(amic ethyl ester) such as PMDA-ODA amic-ethyl ester, BPDA-PDA amic-ethyl ester, and related materials.

The 'necked' ceramic structure can also be surface sealed by application of a high viscosity polymer and curing to high temperature. Again for illustrative purposes, the substrate is treated with a polyimide composition such as BTDA-ODA, BPDA-ODA, partially fluorinated polyamic acid or poly (amic ester) such as hexafluoro isopropylidene diphthalic anhydride (6FDA)-oxydianiline (ODA) (6FDA-ODA) (RC2566, trade name of DuPont) as about 20% solids in NMP by spray, dip, or other liquid application methods, and baked/cured using a programmed oven or a furnace with $N_2$ purge. Typical temperature profile involves: starting at about 70–80° C. followed by a programmed profile using 2–4° C./min ramp rate: ramp to 150° C., 210–240° C., 300° C., with about 20 min hold at each temperature, and finally cured at 350–375° C. for 45–60 minutes and slow cooling to at least 70–80° C. before removing parts. The polyimide solution can also be applied in multiple applications for increasing permeation into the bulk in addition to the surface layers. In that instance, it is preferred that after each application, the polymer be subjected to intermediate bake at about 150° C., and cooled to room temperature before another coating is applied. After the final application, it is subjected to full curing temperature profile up to 350–375° C.

Figure 2:
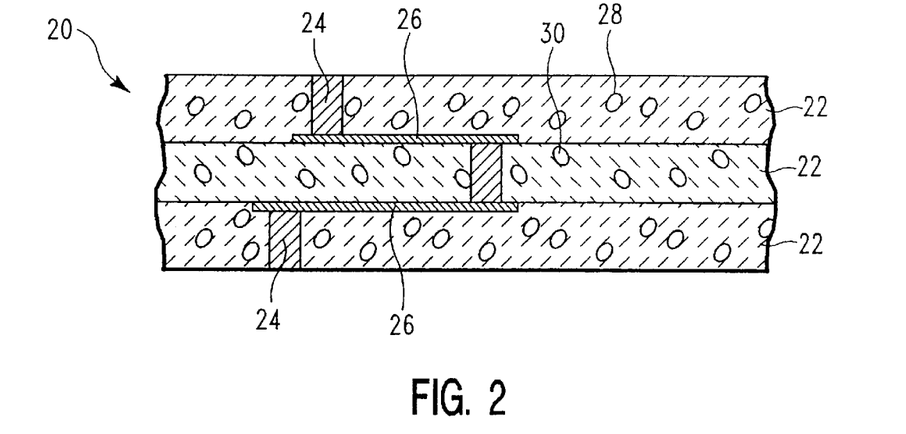
FIG. 2 is a cross-sectional view of a second embodiment of the present invention illustrating a polymer-filled ceramic composite substrate.

Referring now to FIG. 2, there is disclosed a second embodiment of the present invention. Composite substrate 20 includes multiple layers of ceramic 22 having pores 28 which are filled with a polymeric material 30. The porosity 28 is continuous throughout the composite substrate 20 so that the polymeric material 30 can infiltrate through all of the pores 28. The composite substrate 20 will preferably also comprise vias 24 and wiring lines 26.

Figure 3:
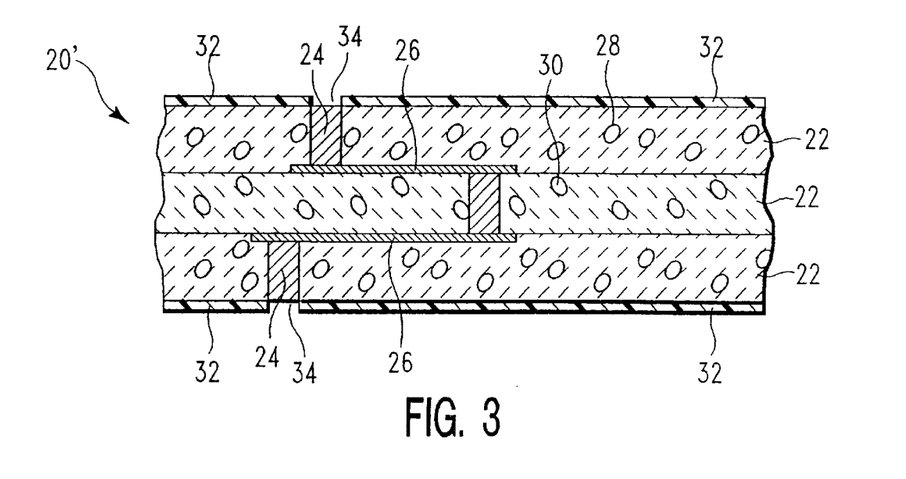
FIG. 3 is a cross-sectional view of a variant of the second embodiment of the present invention illustrating a polymer-filled ceramic substrate where the polymer is only located on the surface region and the periphery of the composite substrate and thus encapsulating the entire structure.

A variant of the second embodiment of the invention is shown in FIG. 3. There, composite substrate 20' has ceramic layers 22 with porosity 28. In the case of composite substrate 20', however, the polymeric material 32 seals the outside of the composite substrate 20' and only partially infiltrates into it, thereby leaving most of porosity 28 free of polymeric material 32. Polymeric material 32 is either removed from, or prevented from depositing in, areas 34 so that electrical connection can be made to a semiconductor device (not shown) or a PCB (not shown).

Figure 5:
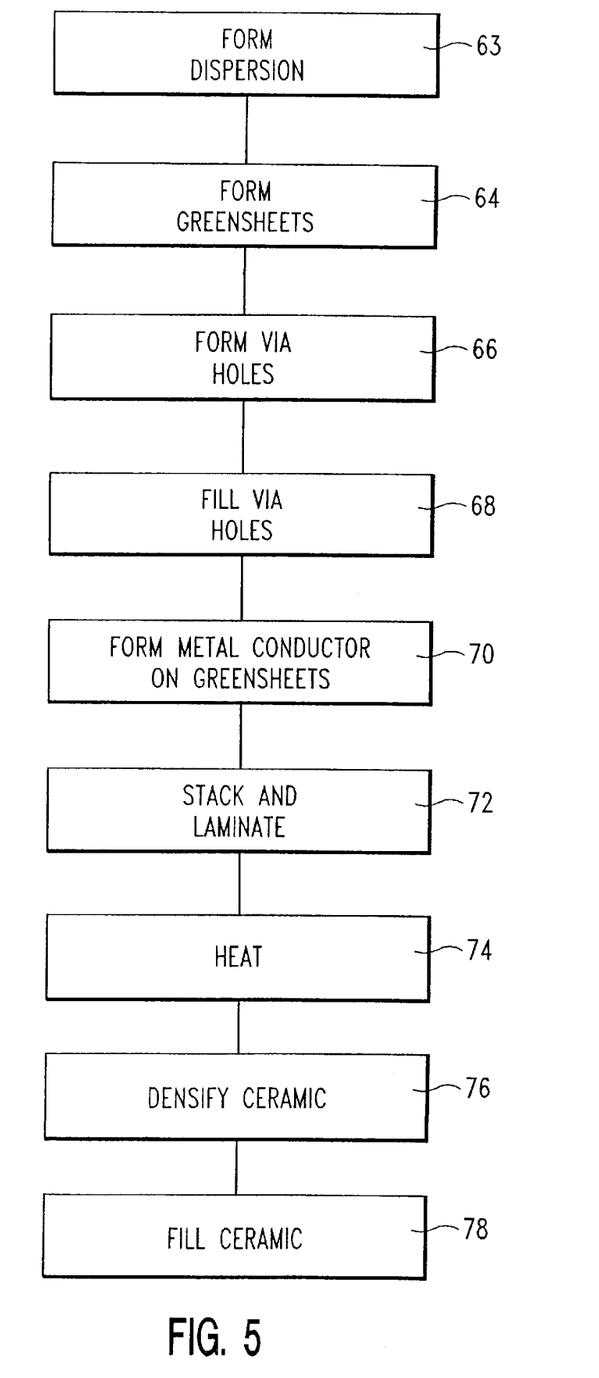
FIG. 5 is a flow chart illustrating the method to form the second embodiment of the present invention.

Referring now to FIG. 5, the method of making the second embodiment of the invention will be discussed. Ceramic material is mixed with a polymer binder material in a solvent carrier with appropriate additives such as a plasticizer, surfactant/dispersant, antioxidant and coloring agents to form dispersion 63, also known as a green sheet slurry. The aforementioned ingredients are mixed in a high shear mixing process using a planetary mixer or a ball mill or a roll mill to provide an homogeneous slurry for casting. For filler wettability with the polymer binder system and dispersion stability, it is generally desirable to surface modify the ceramic material with coupling agents such as organosilanes or organotitanates prior to blending with the polymer. Alternatively, a particle surface modifying agent can be mixed in with the organic binder system and then the ceramic material is blended in to form the composite slurry. The polymer binder is chosen so as to depolymerize as mentioned earlier.

The composite slurry thus formed is cast into sheets (called green sheets) on a carrier, typically PET, polyethylene or polypropylene, using a sheet casting process (64 in FIG. 5). After a drying operation to remove solvent in the cast sheets, a blanking operation generates the desired size individual layers of the composite substrate and punches registration holes necessary for alignment.

The backing sheet material is then removed and vias are formed (66 in FIG. 5) in each layer by mechanical punching, laser drilling, or chemically etching, then filled with an electrically conductive metal (68 in FIG. 5). The vias can be filled with a metallic paste as is conventional. Alternatively, the via metallurgy can be formed by filling with solid metal deposited by known techniques such as plating or subtractive etch, or by mechanically positioning electrically conductive metal elements, for example, molded or inserted by pressing in metal spheres in position. Where the vias are filled by using an electrically conductive paste, the green sheets are dried to remove volatiles. Then, the signal and wiring metallization patterns are formed on the surface of the green sheet layer (70 in FIG. 5) by screen printing or extrusion screening a conductive paste formulated with a metal filler using conventional multilayer ceramic fabrication techniques. Alternatively, the signal and wiring metallization can be formed from solid metal (such as by a decal process) and then transferred to the surface of the green sheet layer.

The individual layers are inspected and then the desired number of layers are aligned and stacked (72 in FIG. 4), placing a thin non-stick polymer sheet on the top and bottom layers of the stack, and laminated using a hydraulic uniaxial press at 150–350° C. and 200–2000 psi pressure to form a multilayer composite interconnect structure.

Thereafter, the ceramic body is heated (74 in FIG. 5) to a temperature sufficient to depolymerize the polymer binder and remove the carbonaceous residue in a process which is conventionally known and practiced as binder burnoff. The sintering temperature is then raised to a temperature sufficient for the ceramic to partially densify (76). Partial densification of ceramic or 'bisque' firing generates a porous or skeletal ceramic body as is well known in the ceramic arts. After the now porous ceramic body is cooled to room temperature and removed from the furnace, the polymeric material noted previously is partially or fully infiltrated (78 in FIG. 5) into the porous ceramic body. Subsequently, the laminated structure is subjected to a plating process for surface finishing metal deposition, typically Ni/Au by an electroless process.

Figures 7, 8:
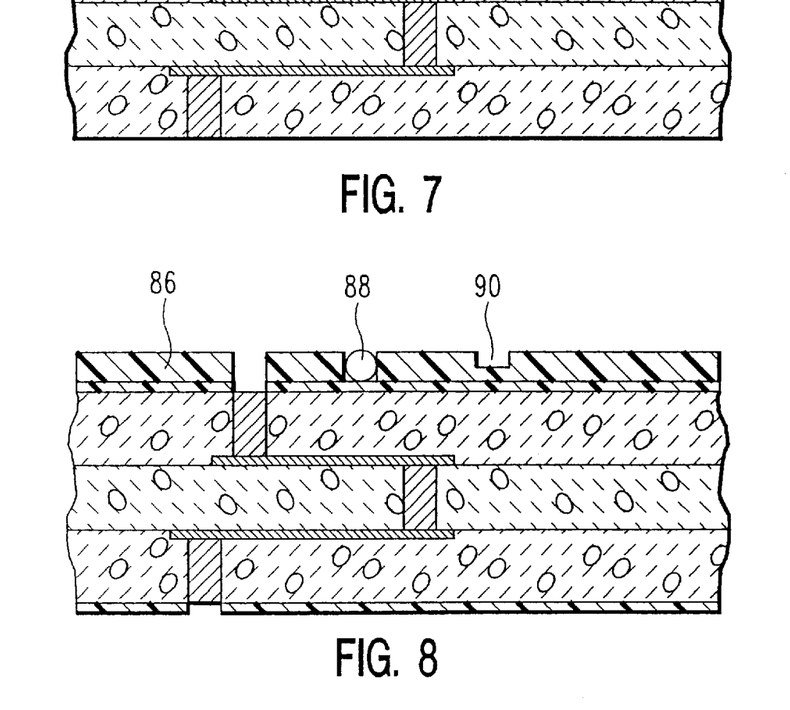
FIG. 7 is a cross-sectional view similar to FIG. 2 but with a surface layer in place for optical transmission of a signal.
FIG. 8 is a cross-sectional view similar to FIG. 3 but with a surface layer in place for optical transmission of a signal.

Prior to surface finishing, at least one surface layer can be added that is especially adapted for supporting high density electronic metal conductors and/or high density optical waveguides for the transmission of electrons and/or photons, respectively, Such a surface layer is shown in FIGS. 7 and 8 as surface layer 86 having waveguides 88 (e.g., an optical fiber) and/or 90 (e.g., an open channel). FIG. 7 generally corresponds to FIG. 2 but with the surface layer 86. Similarly, FIG. 8 generally corresponds to FIG. 3 but with the surface layer 86. The composition of the surface layers is 30 to 100% by weight polymeric material and 70 to 0% by weight ceramic.

Figure 10:
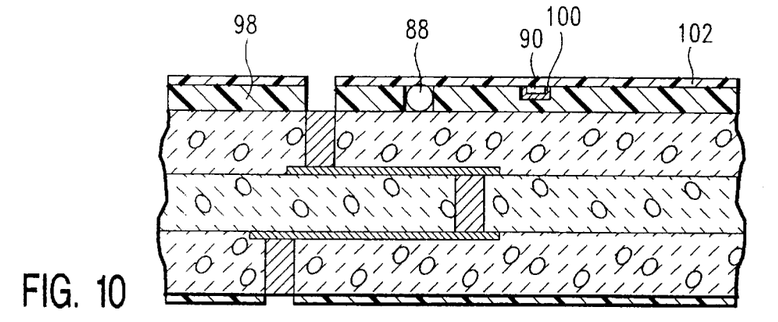
FIG. 10 is a cross-sectional view similar to FIG. 2 but with a layer in place for supporting optical transmission of a signal and a covering surface layer.
Figure 11:
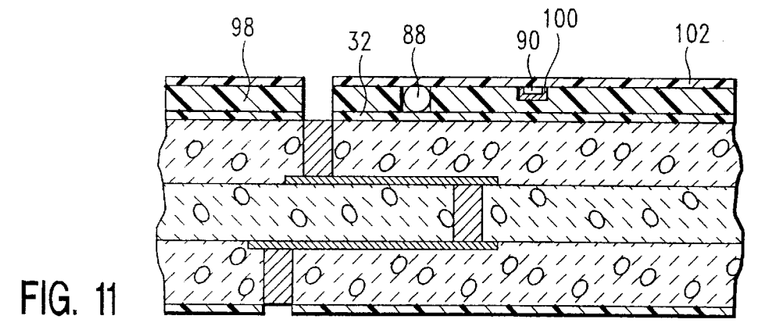
FIGS. 11 and 12 are cross-sectional views similar to FIG. 3 but with a layer in place for supporting optical transmission of a signal.

Alternatively, ceramic-filled polymeric layer 98 can be formed to support waveguide 88 and/or channel 90 as shown in FIGS. 10 and 11. In this embodiment, channel 90 should be lined with a layer 100 of polymeric material. Note that channel 90 is left unfilled. Lastly, polymeric surface layer 102 is formed.

Figure 12:
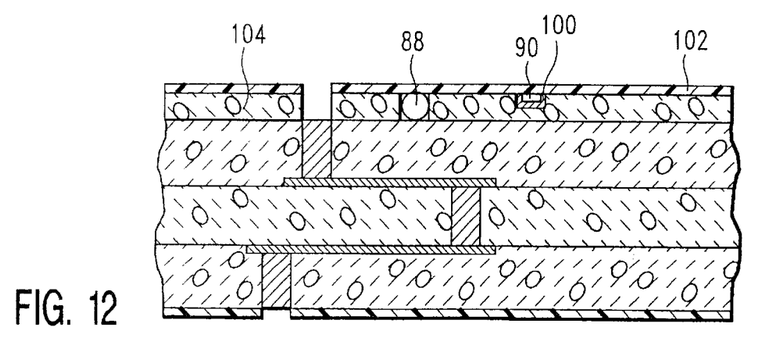

As yet another embodiment as illustrated in FIG. 12, sealing layer 32 shown in FIG. 11 can be dispensed with. Then layer 104 can be a ceramic-filled polymeric material or an unfilled ceramic material, similar to the rest of the substrate. Sealing for the substrate would be provided by polymeric surface layer 102.

Where the surface layers 86, 102 and liner 100 are to be used for high density optical waveguides, there should be no ceramic filler in the surface layer. The polymeric material should be an optically transparent, low (optical) loss material. Some exemplary materials for the surface layer are fluorinated polymers such as fluorinated and perfluorinated polyimides; acrylic polymers such as fluoroalkyl (methacrylate), perfluoro(methacrylate), and alkylmethacrylate homopolymers/copolymers such as PMMA and PMMA/polystyrene copolymers; polyetherketone; polyesters; and urethane-acrylic polymers. The waveguides can be optical fibers, open channels for optical transmission or opotical waveguides. The dielectric material should preferably have a different index of refraction so as to refract the light and keep it within the waveguide.

It will be apparent to those skilled in the art having regard to this disclosure that other modifications of this invention beyond those embodiments specifically described here may be made without departing from the spirit of the invention. Accordingly, such modifications are considered within the scope of the invention as limited solely by the appended claims.

What is claimed is:

1. A composite substrate comprising a plurality of adjacent layers, each of the adjacent layers comprising a mixture of a polymeric and a ceramic material, wherein the substrate has a coefficient of thermal expansion of 8 to 14 ppm/°C. at 100° C. and a dielectric constant less than 4, said composite substrate being adapted for use as an optical and/or electronic substrate and further comprising a surface layer comprising 100% by weight polymeric material and suitable for supporting at least one optical waveguide.

2. The composite substrate of claim 1 wherein each of the layers comprises 30 to 90 weight % polymeric material and 10 to 70 weight % ceramic material.

3. The composite substrate of claim 1 wherein each of the layers comprises 40 to 60 weight % polymeric material and 40 to 60 weight % ceramic material.

4. The composite substrate of claim 1 wherein the polymeric material is selected from the group consisting of fluorinated polyimides, acrylic polymers, polyetherketone, polyesters, and urethane-acrylic polymers.

5. A composite substrate comprising a plurality of adjacent layers, each of the adjacent layers comprising a mixture of a polymeric and a ceramic material, wherein the substrate has a coefficient of thermal expansion of 8 to 14 ppm/°C. at 100° C. and a dielectric constant less than 4, said composite substrate being adapted for use as an optical and/or electronic substrate, wherein one of the plurality of adjacent layers supports at least one optical waveguide and further comprising a surface layer adjacent to the one of the plurality of layers comprising 100% by weight polymeric material.

6. The composite substrate of claim 5 wherein at least one optical waveguide is a channel, the channel further comprising a liner of 100% by weight polymeric material.

7. The composite substrate of claim 6 wherein the polymeric material for the liner and surface layer is selected from the group consisting of fluorinated polyimides, acrylic polymers, polyetherketone, polyesters, and urethane-acrylic polymers.

8. The composite substrate of claim 1 wherein the ceramic is selected from the group consisting of silica, fused silica, quartz, alumina silicates, magnesia silicates, boria silicates, and mixtures thereof.

9. The composite substrate of claim 1 wherein the polymeric material is selected from the group consisting of thermoplastic polyesters, LC polyesters, LCP-thermoplastic polymer blends, flexible-planar chain polyimides, siloxane polyimides, fluorinated polyimides, low thermal expansion polyimides of rod-like structure, thermoplastic polymers, poly(cyclo-olefins), poly(benzocyclobutenes), cyanate ester resins, cynate ester/epoxy blends, bis-maleimide resins, polyvinyl butyral, poly(alkylmethacrylates), poly(alphmethylstyrene) and mixtures thereof.

10. The composite substrate of claim 1 wherein each of the plurality of layers has at least one via.

11. The composite substrate of claim 1 further comprising conductive lines between each pair of layers.

12. A composite substrate comprising a plurality of layers, each of the layers comprising a polymer-filled ceramic material wherein the substrate has a coefficient of thermal expansion of 8 to 14 ppm/°C. at 100° C. and a dielectric constant less than 4, said composite substrate being adapted for use as an optical and/or electronic substrate wherein the polymeric material filling the ceramic material is selected from the group consisting of flexible-planar chain polyimides, siloxane polyimides, low CTE polyimides, fluorinated polyimides, poly(arylene ether), poly(cyclo-olefins), poly(benzocyclobutenes), cyanate ester resins, cynate ester/epoxy blends, bis-maleimide (BMI) resins and mixtures thereof.

13. The composite substrate of claim 12 further comprising a surface layer comprising 100% by weight polymeric material and suitable for supporting at least one optical waveguide.

14. The composite substrate of claim 13 wherein the polymeric material is selected from the group consisting of fluorinated polyimides, acrylic polymers, polyetherketone, polyesters, and urethane-acrylic polymers.

15. The composite substrate of claim 12 wherein one of the plurality of layers supports at least one optical waveguide and further comprising a surface layer adjacent to the one of the plurality of layers comprising 100% by weight polymeric material.

16. The composite substrate of claim 15 wherein at least one optical waveguide is a channel, the channel further comprising a liner of 100% by weight polymeric material.

17. The composite substrate of claim 16 wherein the polymeric material for the liner and surface layer is selected from the group consisting of fluorinated polyimides, acrylic polymers, polyetherketone, polyesters, and urethane-acrylic polymers.

18. The composite substrate of claim 12 wherein the ceramic is selected from the group consisting of silica, fused silica, quartz, alumina silicates, magnesia silicates, boria silicates, and mixtures thereof.

19. The composite substrate of claim 12 wherein each of the plurality of layers has at least one via.

20. The composite substrate of claim 12 further comprising conductive lines between each pair of layers.

21. A composite substrate comprising a plurality of adjacent layers, each of the adjacent layers comprising a filler consisting of ceramic material dispersed in a polymeric matrix and having 30 to 90 weight % polymeric material and 10 to 70 weight % ceramic material, wherein the substrate has a coefficient of thermal expansion of 8 to 14 ppm/°C. at 100° C. and a dielectric constant less than 4, said composite substrate being adapted for use as an optical and/or electronic substrate, wherein the polymeric matrix is selected from the group consisting of LC polyesters, flexible-planar chair polyimides, siloxane polyimides, fluorinated polyimides, low thermal expansion polyimides, poly(benzocyclobutenes), poly(arylene ether), cyanate ester resins, cynate ester/epoxy blends, bis-maleimide resins and mixtures thereof.

22. The composite substrate of claim 21 further comprising a surface layer comprising 100% by weight polymeric material and suitable for supporting at least one optical waveguide.

23. The composite substrate of claim 22 wherein the polymeric material is selected from the group consisting of fluorinated polyimides, acrylic polymers, polyetherketone, polyesters, and urethane-acrylic polymers.

24. The composite substrate of claim 21 wherein one of the plurality of adjacent layers supports at least one optical waveguide and further comprising a surface layer adjacent to the one of the plurality of adjacent layers comprising 100% by weight polymeric material.

25. The composite substrate of claim 24 wherein at least one optical waveguide is a channel, the channel further comprising a liner of 100% by weight polymeric material.

26. The composite substrate of claim 25 wherein the polymeric material for the liner and surface layer is selected from the group consisting of fluorinated polyimides, acrylic polymers, polyetherletone, polyesters, and urethane-acrylic polymers.

27. The composite substrate of claim 21 wherein the ceramic is selected from the group consisting of silica, fused silica, quartz, alumina silicates, magnesia silicates, boria silicates, and mixtures thereof.

28. The composite substrate of claim 21 wherein each of the plurality of layers has at least one via.

29. The composite substrate of claim 21 further comprising conductive lines between each pair of layers.

30. The composite substrate of claim 12 wherein the polymeric material is selected from the group consisting of fluorinated polyimides and low CTE polyimides.

* * * * *